United States Patent [19]
Sawai et al.

[11] Patent Number: 5,590,412
[45] Date of Patent: Dec. 31, 1996

[54] COMMUNICATION APPARATUS USING COMMON AMPLIFIER FOR TRANSMISSION AND RECEPTION

[75] Inventors: Tetsuro Sawai, Ashiya; Hisanori Uda, Hirakata; Toshikazu Hirai, Hirakata; Toshikazu Imaoka, Hirakata; Yasoo Harada, Hirakata; Keiichi Honda, Hirakata; Masao Nishida, Sakai, all of Japan

[73] Assignee: Sanyo Electric Co., Ltd., Moriguchi, Japan

[21] Appl. No.: 342,220

[22] Filed: Nov. 18, 1994

[30] Foreign Application Priority Data

Nov. 19, 1993 [JP] Japan .................. 5-290992

[51] Int. Cl.⁶ .................. H04B 1/44; H03F 3/193; H03F 3/62
[52] U.S. Cl. .................. 455/82; 455/83; 455/86; 330/282; 330/302; 330/310
[58] Field of Search .................. 455/84–86, 75, 455/76, 82, 83, 78; 330/110, 282, 86, 302, 310

[56] References Cited

U.S. PATENT DOCUMENTS

| | | | |
|---|---|---|---|
| 3,146,397 | 8/1964 | Broadhead, Jr. .................. | 455/78 |
| 3,519,765 | 7/1970 | Huber .................. | 455/84 |
| 4,591,802 | 5/1986 | Asazawa .................. | 330/302 |
| 5,023,569 | 6/1991 | Raven .................. | 330/302 |
| 5,051,705 | 9/1991 | Moghe et al. .................. | 330/282 |
| 5,057,791 | 10/1991 | Thompson et al. .................. | 455/84 |

OTHER PUBLICATIONS

"A New Two–Mode Channel FET (TMT) For Super–Low Noise And High–Power Applications"—Minoru Sawada et al. (IEEE Electron Device Letters) vol. 14, No. 7 Jul. 1993.
"A 2/4GHz Single Chip Transceiver"—Monolithic Circuits Symposium (IEEE 1993 Microwave and Millimeter–Wave—Jun. 1993).

*Primary Examiner*—Chi H. Pham
*Attorney, Agent, or Firm*—Darby & Darby, P.C.

[57] ABSTRACT

A communication apparatus for use in a portable telephone is disclosed which has a transmit-receive common amplifier for amplifying a transmitted signal or received signal, and a mixer for frequency-mixing the transmitted signal or the received signal with a local oscillator output, wherein connection between the mixer and an input side of the amplifier and connection between the mixer and an output side of the amplifier are made by means of respective signal-path selector switches. During reception, a deep bias is applied to an FET of the transmit-receive common amplifier to reduce current consumption, and during transmission, a shallow bias is applied to the FET of the transmit-receive common amplifier for increased output.

19 Claims, 9 Drawing Sheets

COMMUNICATION APPARATUS USING COMMON AMPLIFIER FOR TRANSMISSION AND RECEPTION

BACKGROUND OF THE INVENTION

1. Field of the Invention

The present invention relates to a communication apparatus suitable for mobile communications use, and a transmit-receive common amplifier used in a communication apparatus.

2. Description of Related Art

As car telephone systems have come into commercial operation in various parts of the world, mobile communications have been attracting attention for their future potential. Mobile communications cover a very wide range of fields, including car telephones, business-use radio communications, personal radio communications, and many other fields of applications. These fields have been developing recently at a rapid pace, and in any of these fields, efforts are being made to reduce the size, weight, and power consumption of mobile units for increased convenience of portability.

To achieve this, much of the efforts are focused on making the amplifiers and mixers used in the radio sections of mobile units, as well as components of the baseband sections, smaller and lighter by designing them in integrated circuit form, and vigorous development is also under way to reduce the size of passive components such as filters.

However, simply improving these component parts is not enough to achieve a drastic reduction in the size of the mobile unit itself. As disclosed in IEEE 1993 MICROWAVE AND MILLIMETER-WAVE MONOLITHIC CIRCUITS SYMPOSIUM, pp. 23–26, for example, a reduction in circuit size is achieved by designing a common mixer that can be used for both transmission and reception.

There has also been developed a transistor known as two-mode channel transistor TMT, which is currently under application for a U.S. patent (U.S. Ser. No. 8/109,354) by the applicant of this invention; with only one transistor of this type, transmission and reception can be served satisfactorily and the circuitry can be reduced in size without sacrificing circuit performance. The TMT has two electron flow modes: when the gate bias is deep, electrons flow primarily through an undoped semiconductive layer, and when the gate bias is shallow, electrons flow primarily through a highly doped layer. When the gate bias is deep, electrons tend to flow through regions formed away from impurity doped regions and are therefore less affected by impurities; this serves to further suppress noise generation, providing ultra low noise characteristic. On the other hand, when the gate bias is shallow, a high output characteristic is achieved.

In the case of FETs including the TMT, a deep gate bias means that the voltage to be applied to the gate is small and a shallow gate bias means that. the voltage to be applied to the gate is large. For example, when the deep gate bias is −3 V, the shallow gate bias is −1 V large than −3 V.

FIG. 1 is a block diagram showing an RF (radio frequency) radio section when a TDMA-TDD (time division multiple access—time division duplex) communication system is employed. An RF signal received at an antenna 1 is passed through a transmit-receive common band-pass filter (BPF) 41, and inputted to reception amplifiers 21 and 22 via a transmit-receive common selector switch 4 with a selector terminal 4a connected to a common terminal 4c. The received signal is further passed through a BPF 42 and fed, via a selector terminal 6a and a common terminal 6c in a switch 6, into a mixer 10 where it is mixed with an output from a local oscillator 9 supplied via a buffer amplifier 8. After being down-converted into an intermediate frequency (IF) signal in the mixer 10, the signal is supplied via a switch 7, with a selector terminal 7b connected to a common terminal 7c, to a receiving system circuit for demodulation.

Turning now to the transmitting system, a transmitted signal modulated at the IF band is fed into the mixer 10 via the switch 6 with its selector terminal 6b connected to the common terminal 6c, while at the same time, an output, from the local oscillator 9 is fed into the mixer 10 via the buffer amplifier 8. The IF transmitted signal is up-converted in the mixer 10 into an RF signal. The RF signal is then directed by the switch 7, with its selector terminal 7a connected to the common terminal 7c, is passed through a BPF 43, and is fed into transmission amplifiers 31 and 32 where the signal is amplified to a level that satisfies the specification of the communication apparatus. The amplified signal is then directed by the switch 4 with its selector terminal 4b connected to the common terminal 4c, is passed through the transmit-receive common BPF 41, and is outputted to the antenna 1 from which the radio wave is radiated.

FIGS. 2 and 3 illustrate the block diagram of FIG. 1 in detailed circuit diagram form, FIG. 2 for reception and FIG. 3 for transmission. Bias voltages are also shown in these circuit diagrams.

The switch 4 consists of FETs 51, 52 and resistors 81, 82 connected to the gates of the respective FETs 51, 52. The gates of the FETs 51, 52 are respectively connected to voltage sources (voltage $V_{ct l1}$, voltage $V_{ct l2}$) via the respective resistors 81, 82.

The reception amplifiers 21, 22 together consist of a reception amplifier input matching circuit 101, a reception amplifier output matching circuit 102, FETs 53 and 54, a blocking capacitor 77, and inductors 71, 72 and resistors 83, 84 for bias application. The drain of the FET 53 whose gate is connected to the reception amplifier input matching circuit 101 is connected to a voltage source (voltage $V_{DD1}$) via the inductor 71; the gate of the FET 53 is also connected to a voltage source (voltage $V_{GG1}$) via the resistor 83. The blocking capacitor 77 is interposed between the drain of the FET 53 and the gate of the FET 54. The gate of the FET 54 whose drain is connected to the reception amplifier output matching circuit 102 is connected to the voltage source (voltage $V_{GG1}$) via the resistor 84; the drain of the FET 54 is also connected to the voltage source (voltage $V_{DD1}$) via the inductor 72. The sources of the FETs 53 and 54 are grounded.

The transmission amplifiers 31, 32 together consist of a transmission amplifier input matching circuit, 104, a transmission amplifier output matching circuit 103, FETs 55 and 56, a blocking capacitor 78, and inductors 73, 74 and resistors 85, 86 for bias application. The drain of the FET 56 whose gate is connected to the transmission amplifier input matching circuit 104 is connected to a voltage source (voltage $V_{DD2}$) via the inductor 74; the gate of the FET 56 is also connected to a voltage source (voltage $V_{GG2}$) via the resistor 86. The blocking capacitor 78 is interposed between the drain of the FET 56 and the gate of the FET 55. The gate of the FET 55 whose drain is connected to the transmission amplifier output matching circuit 103 is connected to the voltage source (voltage $V_{GG2}$) via the resistor 85; the drain of the FET 55 is also connected to the voltage source (voltage $V_{DD2}$) via the inductor 73. The sources of the FETs 55 and 56 are grounded.

The switch 6 consists of FETs 57, 58 and resistors 87, 88 connected to the gates of the respective FETs 57, 58. The gates of the FETs 57, 58 are respectively connected to the voltage sources (voltage $V_{ctl1}$, voltage $V_{ctl2}$) via the respective resistors 87, 88. Also, the switch 7 consists of FETs 59, 60 and resistors 89, 90 connected to the gates of the respective FETs 59, 60. The gates of the FETs 59, 60 are respectively connected to the voltage sources (voltage $V_{ctl2}$, voltage $V_{ctl1}$) via the respective resistors 89, 90.

The mixer 10 consists of a mixer input matching circuit 105, a mixer output matching circuit 106, a dual-gate FET 61, and an inductor 75 and resistor 91 for bias application. The first gate of the dual-gate FET 61 is connected to a voltage source (voltage $V_{GG3}$) via the resistor 91, while the drain of the FET 61 is connected to a voltage source (voltage $V_{DD}$) via the inductor 75. Further, the first gate, the second gate, and the drain of the dual-gate FET 61 are connected to the mixer input matching circuit 105, a local oscillator input matching circuit 107 described below, and the mixer output matching circuit 106, respectively. The source of the dual-gate FET 61 is grounded.

The buffer amplifier 8 consists of the local oscillator input matching circuit 107, an FET 62, and an inductor 76 and resistor 92 for bias application. The drain of the FET 62 whose gate is connected to the local oscillator 9 is connected to the voltage source (voltage $V_{DD}$) via the inductor 76; the gate of the FET 62 is also connected to the voltage source (voltage $V_{GG3}$) via the resistor 92. The drain of the FET 62 is also connected to the local oscillator input matching circuit 107, while the source of the FET 62 is grounded.

Further, an IF input matching circuit, 108 is provided in the rear-end stage of the transmitting system circuit, and an IF output matching circuit 109 in the front-end stage of the receiving system circuit.

Next, the operation of the above-configured circuit will be described. First, in reception, $V_{ctl1}$ for each of the switches 4, 6, 7 is set, for example, to 0 V to turn on the corresponding FET, and $V_{ctl2}$ is set, for example, to $-3$ V to turn off the corresponding FET, as shown in FIG. 2. The bias voltages, $V_{DD1}$ and $V_{GG1}$, for the reception amplifiers 21, 22 are set at optimum values, i.e., at values that provide low noise characteristics and that minimize current consumption; for example, $V_{DD1}=3$ V and $V_{GG1}=-0.5$ V. For the mixer 10, the drain bias is fixed to a predetermined value (for example, always ON with $V_{DD}=3$ V), and the gate bias is set deep (for example, $V_{GG3}=-2$ V) to reduce the current consumption. During reception, since the transmission amplifiers 31 and 32 are not used, the FETs 55 and 56 are each set in the pinch-off condition ($V_{DD2}=0$ V, $V_{GG2}=-3$ V) to prevent system noise, etc. from leaking outside the system.

Under such bias conditions, the received signal is first passed through the FET 51 in the ON state in the switch 4 that separates reception and transmission, and is then inputted to the reception amplifiers 21, 22. Usually, the reception amplifier input matching circuit 101 is designed to minimize the noise figure of the amplifier, and the reception amplifier output matching circuit 102 is adjusted to achieve the gain matching. The received RF signal is further passed through the BPF 42 and the FET 57 in the ON state, and fed into the mixer 10 where it is mixed with an output power from the local oscillator 9 for conversion into an IF signal. Since the input/output impedance of the BPF 42 is usually 50 Ohms, the input circuit of the mixer 10 is matched to 50 Ohms at the RF band, and the mixer output matching circuit 106 also is adjusted for matching at the RF band so that the output is fed in optimum conditions into the BPF 43 during the transmitting period hereinafter described. Accordingly, the IF signal outputted from the mixer 10 is passed through the FET 60 in the ON state and matched by the IF output matching circuit 109 before being transferred to the receiving system circuit for demodulation.

On the other hand, in transmission, $V_{ctl1}$ is set, for example, to $-3$ V to turn off the corresponding FET, and $V_{ctl2}$ is set, for example, to 0 V to turn on the corresponding FET, as shown in FIG. 3. Since the reception amplifiers 21, 22 are not used, the drain voltage $V_{DD1}$ is set at 0 V and the gate bias $V_{GG1}$ at $-3$ V to put the respective FETs in the pinch-off condition. The bias conditions for the transmission amplifiers 31, 32 are so set as to maximize the output, i.e., $V_{DD2}$ at 3 V and $V_{GG2}$ at $-1$ V. Further, the gate bias for the mixer 10 is set less deep than during the receiving period, to increase the output as compared to that during the receiving period. More specifically, $V_{DD}$ remains at 3 V, but $V_{GG3}$ is set at $-1$ V.

Under such bias conditions, a digital-modulated signal is inputted from the transmitting system circuit to the mixer 10 via the IF input matching circuit 108 and via the FET 58 in the ON state. In the mixer 10, the signal is t mixed with an output signal from the local oscillator 9 for up-conversion. Since the mixer input matching circuit 105 is adjusted for matching at the RF band, as earlier described, the IF input matching circuit 108 is provided to ensure that the IF signal in the IF band is properly inputted to the mixer 10. Furthermore, the gate bias $V_{GG3}$ for the buffer amplifier 8 and the dual-gate FET 61 in the mixer 10 is set less deep than during the receiving period, so that the output power of the local oscillator 9 to be fed into the mixer 10 is increased, and hence a large output power is obtained from the dual-gate FET 61. The mixer output matching circuit 106 of the mixer 10 is matched to 50 Ohms, and the output signal is inputted to the transmission amplifiers 31, 32 via the FET 59 in the ON state and via the BPF 43. The transmission amplifiers 31, 32 amplify the input signal to an output level that satisfies the specification of the communication apparatus, and the amplified RF signal is outputted via the FET 52 in the ON state.

In the case of mobile communications, a very large dynamic range of the reception level poses a problem with the above-described circuit configuration. For example, in a car telephone system, a dynamic range of 70 dB or more is required. When the mobile unit is far away from the base station and the reception level is low, for example, there will be no problem, but when the reception level is high, the amplifiers and mixer used in the mobile unit may be saturated and the signal may not be demodulated properly. In general, the reception amplifier 22 is designed as a variable-gain type, as shown in FIG. 1, to solve this problem. More specifically, the gain is varied by controlling the gate bias $V_{GG1}$. While this method can vary the gain, the problem is increased distortion occurring when the gain is reduced. Another possible method will be to control the level by providing a variable attenuator on the input side of the received signal. This method, however, has the problem that the noise figure is increased.

Furthermore, in the above prior art configuration, the voltage switching between transmission and reception involves changing not only the voltages applied to the switches but the biases applied to the amplifiers. This requires a very complex circuit configuration, and it is extremely difficult to integrate the circuit. Moreover, the circuit requires the provision in duplicate of the amplifiers, BPFs, etc. respectively having the same basic function, and such a circuit design is not appropriate for mobile communications terminals for which smaller size and lighter weight are greatly demanded.

SUMMARY OF THE INVENTION

It is an object of the invention to provide a communication apparatus capable of reducing the frequency variations by the difference of load impedance of the synthesizer between transmission and reception mode, as compared with the prior art example.

It is another object of the invention to provide a communication apparatus that permits a simple circuit construction and hence, a reduction in the size of the apparatus as compared with the prior art example.

It is a further object of the invention to provide a communication apparatus that can simplify bias circuitry as well as control circuitry and that contributes to increasing the production yield.

It is yet another object of the invention to provide a communication apparatus that can prevent an amplifier and a mixer from being saturated.

It is a still further object of the invention to provide a transmit-receive common amplifier that operates stably in either transmit mode or receive mode with simple circuitry.

It is a yet further object of the invention to provide a transmit-receive common amplifier that is small in size and that has low power consumption.

According to the present invention, there is provided a communication apparatus which has a transmit-receive common amplifier for amplifying a transmitted signal or received signal, and a mixer for frequency-mixing the transmitted signal or received signal with a local oscillator output signal, wherein connection between the mixer and an input side of the amplifier and connection between the mixer and an output side of the amplifier are made by means of respective signal-path selector switches.

In a preferred mode of the invention, a buffer amplifier is provided on a local oscillation input side of the mixer, and a common gate bias is applied to the transmit-receive common amplifier, the mixer, and the buffer amplifier.

In another preferred mode of the invention, provision is made so that when the level of the received signal is greater than a predetermined level, the received signal is inputted to the mixer without being passed through the transmit-receive common amplifier.

Further, in the transmit-receive common amplifier used in the communication apparatus of the invention, the gate bias is linked to a feedback resistor and the amount of feedback is varied between transmission and reception mode.

The above and further objects and features of the invention will more fully be apparent from the following detailed description with accompanying drawings.

DESCRIPTION OF THE PREFERRED EMBODIMENTS

The present invention will now be described in detail below with reference to the drawings illustrating the preferred embodiments thereof.

Figure 1:
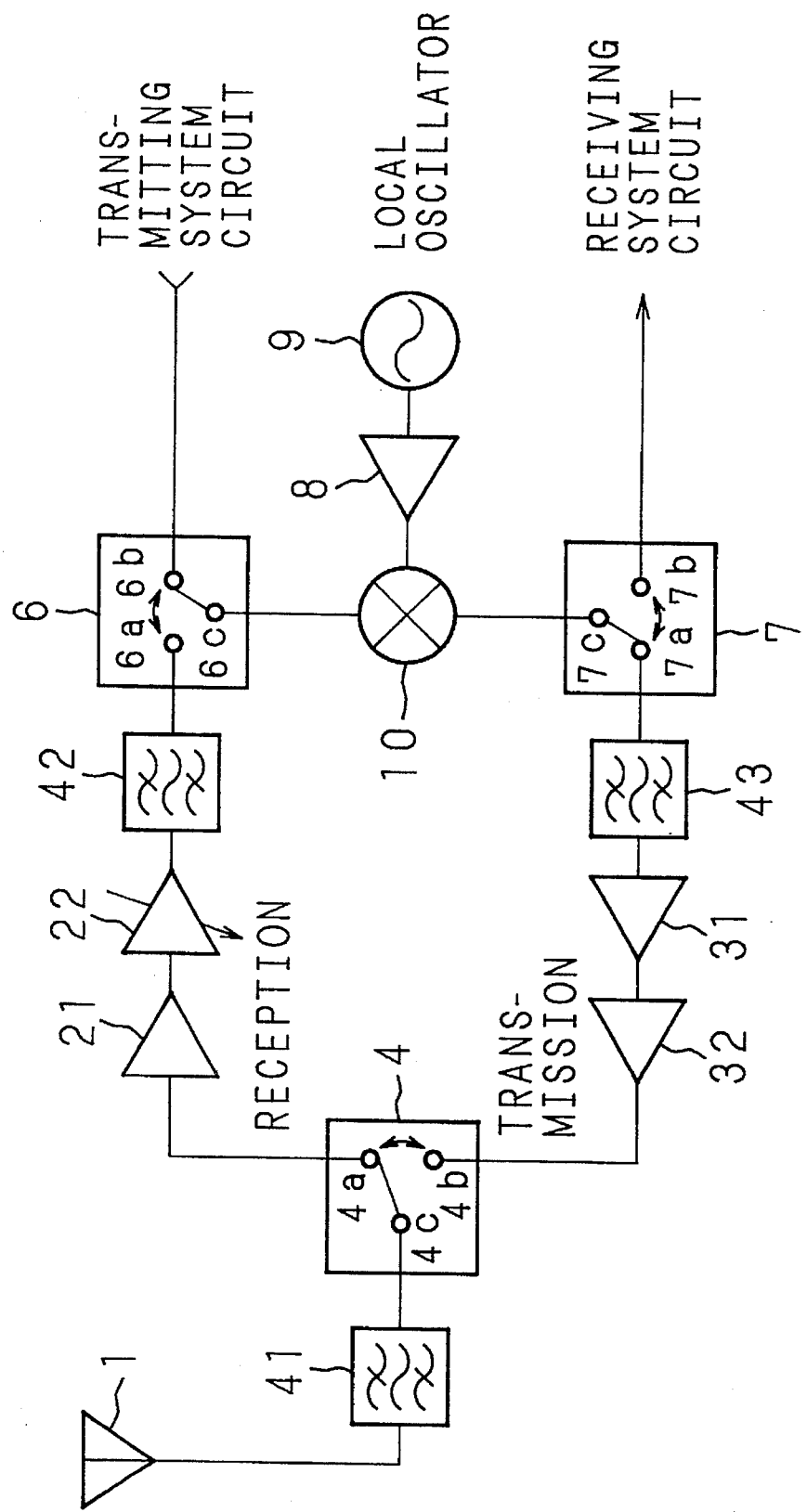
FIG. 1 is a block diagram showing an RF section of a prior art communication apparatus.
Figure 2:
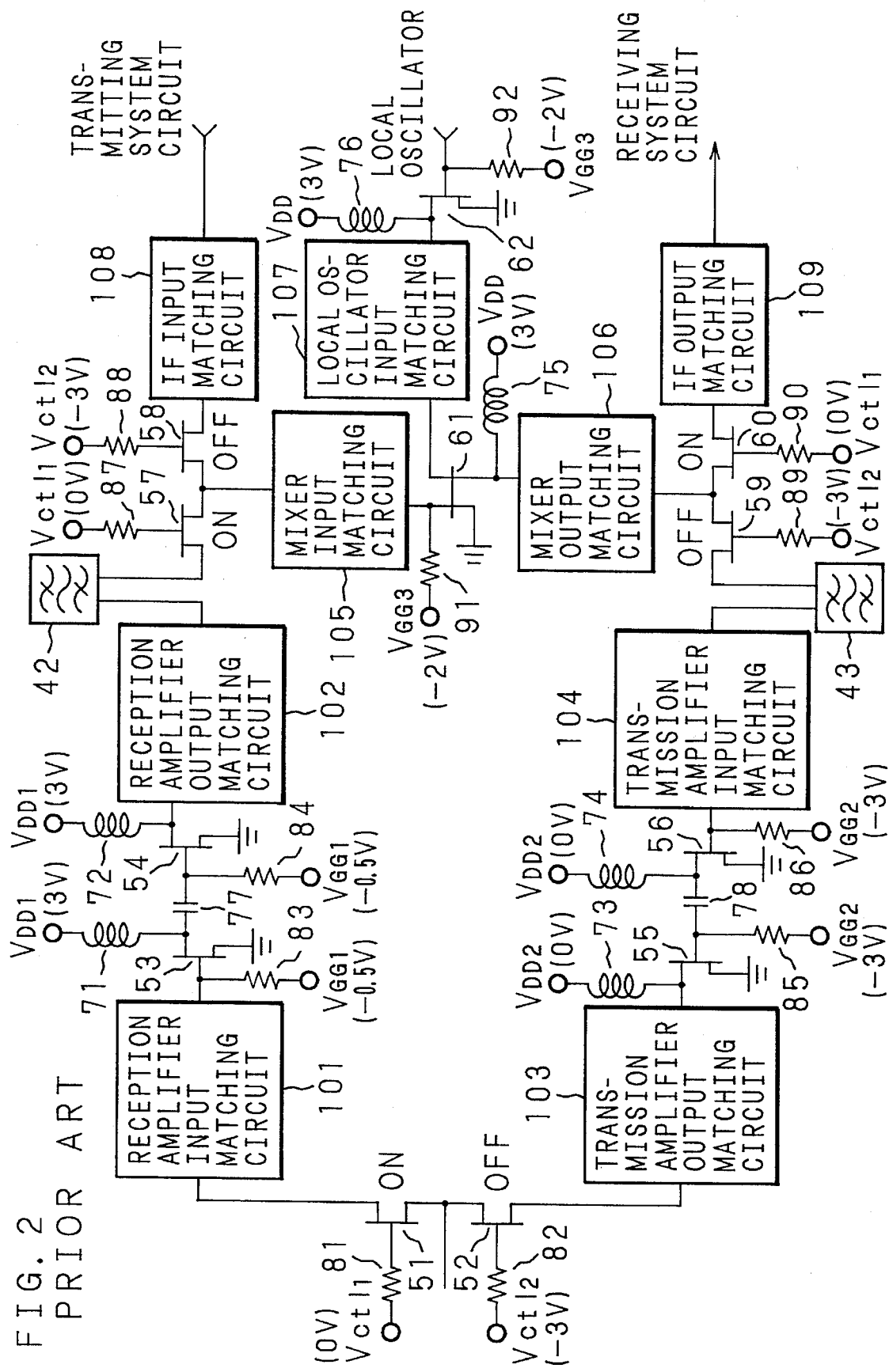
FIG. 2 is a diagram showing the circuit configuration of the RF section of the prior art communication apparatus (in reception)
Figure 3:
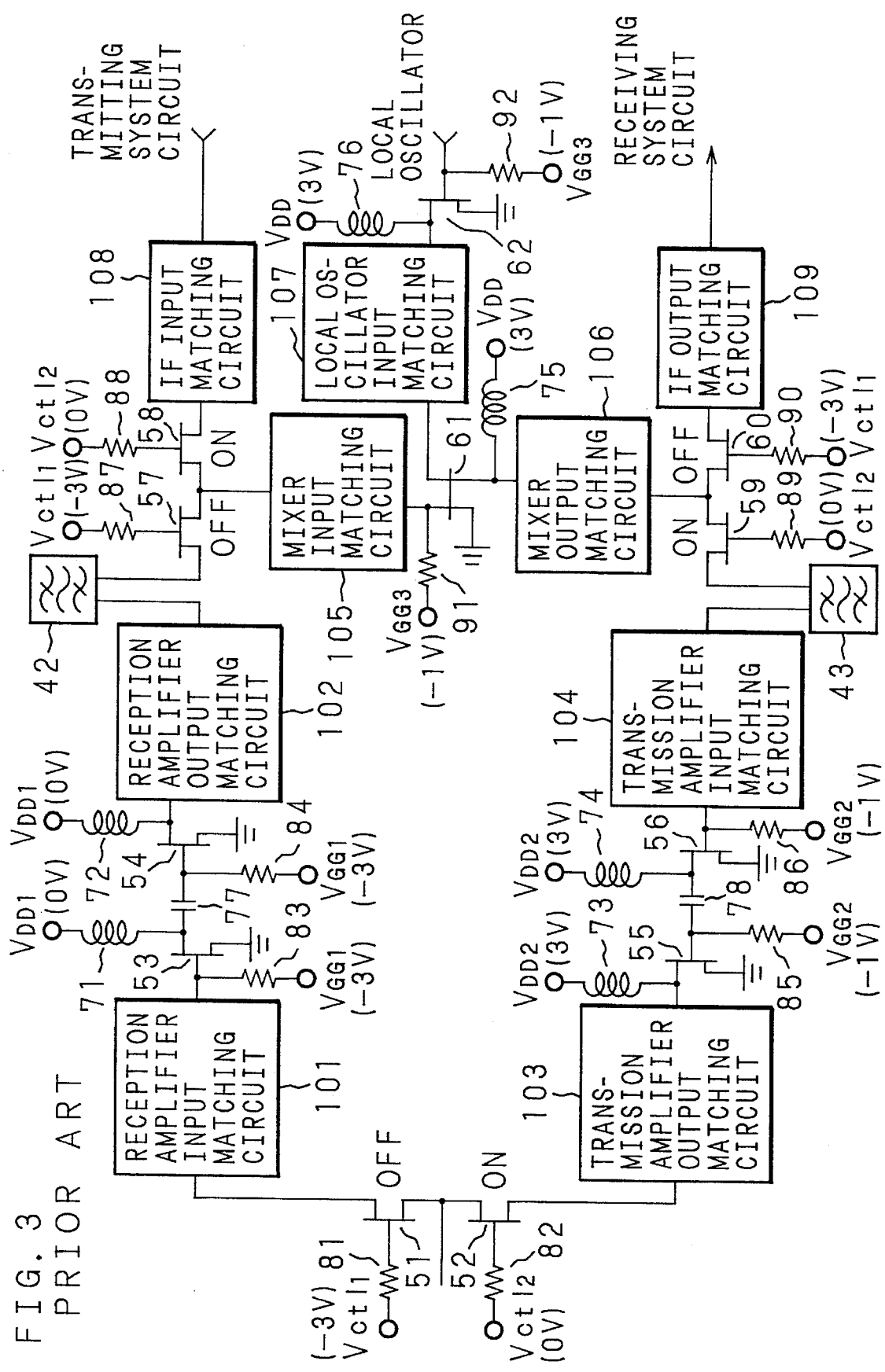
FIG. 3 is a diagram showing the circuit configuration of the RF section of the prior art communication apparatus (in transmissions)
Figure 4:
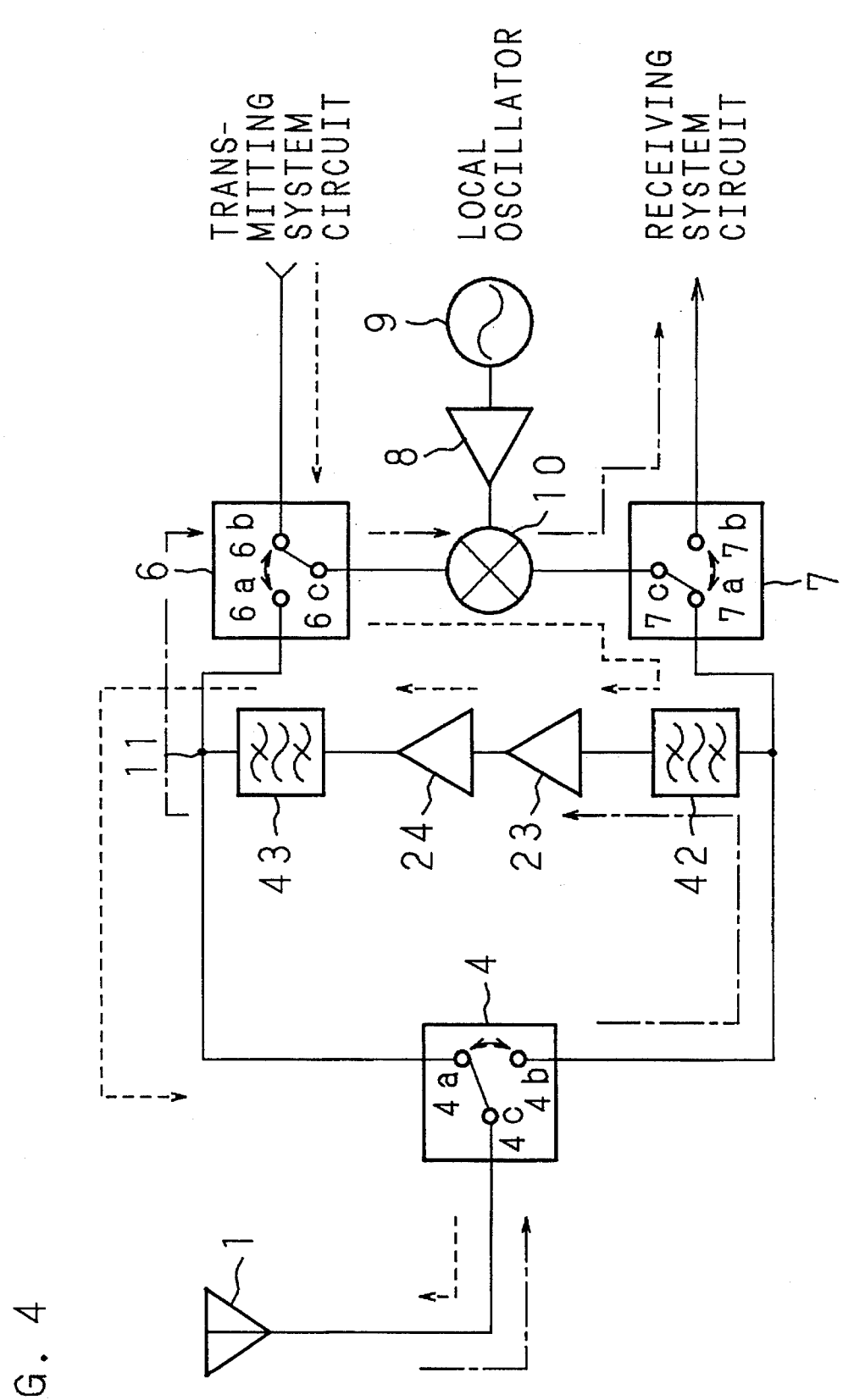
FIG. 4 is a block diagram showing an RF section of a communication apparatus according to the present invention.

FIG. 4 is a block diagram showing the configuration of an RF section of a communication apparatus according to the present invention when a TDMA-TDD communication system is employed. In FIG. 4, the numerals 23 and 24 indicate transmit-receive common amplifiers; in the present invention, not only the mixer 10 is used for both transmission and reception, as in the above-mentioned prior art example, but the amplifiers are also used in common for both transmission and reception.

In reception, the switch 4 connects the selector terminal 4b to the common terminal 4c, the switch 6 connects the selector terminal 6a to the common terminal 6c, and the switch 7 connects the selector terminal 7b to the common terminal 7c. An RF signal received at the antenna 1 is passed via the switch 4 and BPF 42 and inputted to the transmit-receive common amplifiers 23 and 24. The signal is then passed via the BPF 43 and switch 6, and fed into the mixer 10 where the signal is mixed with an output signal from the local oscillator 9 supplied via the buffer amplifier 8, for down-conversion. The resulting IF signal is transferred via the switch 7 to the receiving system circuit for demodulation.

On the other hand, in transmission, the switch 4 connects the selector terminal 4a to the common terminal 4c, the switch 6 connects the selector terminal 6b to the common terminal 6c, and the switch 7 connects the selector terminal 7a to the common terminal 7c. The transmitted signal modulated at the IF band is passed via the switch 6 and fed into the mixer 10 where it is frequency-mixed with an output signal from the local oscillator 9 supplied via the buffer amplifier 8, for up-conversion. The resulting RF signal is passed via the switch 7 and BPF 42 and inputted to the transmit-receive common amplifiers 23 and 24, and then passed via the BPF 43 and switch 4 and outputted to the antenna 1 from which the signal is radiated.

In FIG. 4, when an input level greater than a predetermined level is detected in the receiving system circuit during reception, the connection of the common terminal 4c in the switch 4 is switched from the selector terminal 4b to the selector terminal 4a, and at the same time, the drain bias is turned off to the transmit-receive common amplifiers 23 and 24 so that the impedance as viewed from node 11 and toward the transmit-receive common amplifiers 23 and 24 is increased, allowing the received signal to be inputted to the mixer 10 directly via the switch 6. In this case, since the received signal is not passed through the transmit-receive common amplifiers 23, 24, the level of the input to the mixer 10 decreases by an amount equivalent to the gain of the transmit-receive common amplifiers 23, 24. This prevents the transmit-receive common amplifiers 23, 24 and the mixer 10 from being saturated. In this case, the received signal is not routed through the BPFs 42, 43, but if the RF matching circuit in the mixer 10 is set to a particularly narrow band and if the switch 4 is set to the normal receive mode with the selector terminal 4b connected to the common terminal 4c to monitor the level of the IF signal via the receiving system circuit from time to time, input of other frequency signals will not present any problem.

As explained in the description of the prior art, different characteristics are required of the amplifiers, mixer, and buffer amplifier during reception and during transmission. In the above-mentioned prior art example that uses a common mixer and a common buffer amplifier for both transmission and reception, the above requirement is addressed by varying the applied bias voltage between reception and transmission; for the amplifiers, optimum devices (FETs) are respectively chosen, and bias conditions suitable for respective requirements are set.

Figure 5:
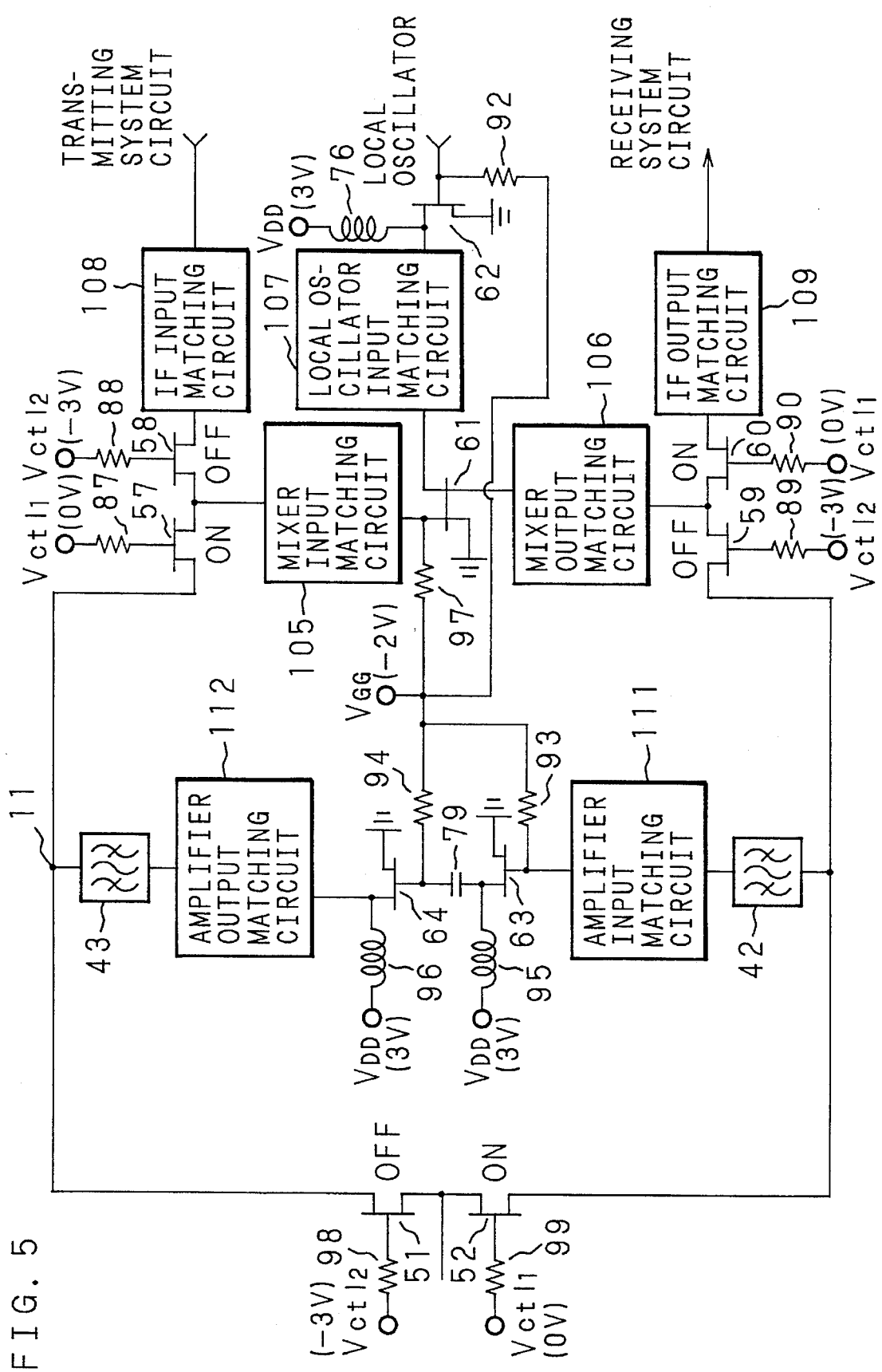
FIG. 5 is a diagram showing the circuit configuration of the RF section of the communication apparatus according to the present invention (in reception)
Figure 6:
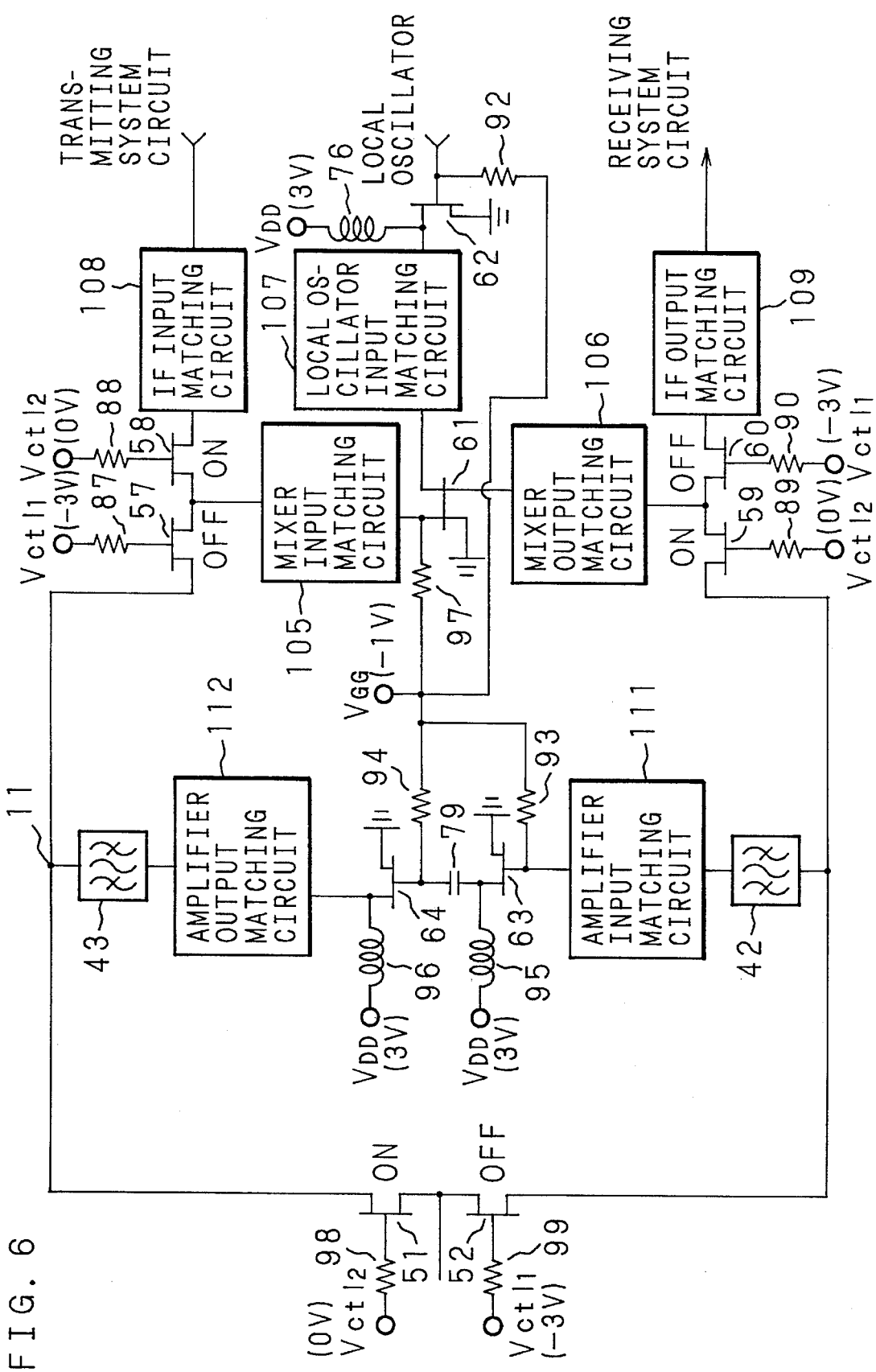
FIG. 6 is a diagram showing the circuit configuration of the RF section of the communication apparatus according to the present invention (in transmission)

An example of the present invention will be described in detail below, the description including bias conditions for the these parts. Generally, the signal level to be handled is large in transmission and small in reception. Therefore, the gate bias to be applied should be set shallow during transmission and deep during reception. FIGS. 5 and 6 show the block diagram of FIG. 4 in detailed circuit diagram form, FIG. 5 for reception and FIG. 6 for transmission. Bias voltages are also shown in these circuit diagrams.

The switch 4 consists of FETs 51, 52 and resistors 98, 99 connected to the gates of the respective FETs 51, 52. The gates of the FETs S1 and 52 are connected to voltage sources (voltage $V_{ctl2}$, voltage $V_{ctl1}$) via the resistors 98 and 99, respectively.

The transmit-receive common amplifiers 23 and 24 together consist of an amplifier input matching circuit 111, an amplifier output matching circuit 112, FETs 63 and 64, a blocking capacitor 79, and inductors 96, 96 and resistors 93, 94 for bias application. The drain of the FET 63 whose gate is connected to the amplifier input matching circuit 111 is connected to a voltage source (voltage $V_{DD}$) via the inductor 95; the gate of the FET 63 is also connected to a voltage source (voltage $V_{GG}$) via the resistor 93. The blocking capacitor 79 is interposed between the drain of the FET 63 and the gate of the FET 64. The gate of the FET 64 whose drain is connected to the amplifier output matching circuit 112 is connected via the resistor 94 to the voltage source (voltage $V_{GG}$) that is shared with the FET 63; the drain of the FET 64 is also connected to the voltage source (voltage $V_{DD}$) via the inductor 96. The sources of the FETs 63 and 64 are grounded.

The switch 6 consists of FETs 57, 58 and resistors 87, 88 connected to the gates of the respective FETs 57, 58. The gates of the FETs 57 and 58 are connected to voltage sources (voltage $V_{ctl1}$, voltage $V_{ctl2}$) via :the resistors 87 and 88, respectively. The switch 7 consists of FETs 59, 60 and resistors 89, 90 connected to the gates of the respective FETs 59, 60. The gates of the FETs 59 and 60 are connected to voltage sources (voltage $V_{ctl2}$, voltage $V_{ctl1}$) via the resistors 89 and 90, respectively.

The mixer 10 consists of a mixer input matching circuit 105, a mixer output matching circuit 106, a dual-gate FET 61, and a resistor 97 for bias application. The first gate of the dual-gate FET 61 is connected via the resistor 97 to the voltage source (voltage $V_{GG}$) that is shared with the FETs 63 and 64. Further, the first gate, the second gate, and the drain of the dual-gate FET 61 are connected to the mixer input matching circuit 105, a local oscillator input matching circuit 107 hereinafter described, and the mixer output matching circuit 106, respectively. The source of the dual-gate FET 61 is grounded.

The buffer amplifier 8 consists of the local oscillator input matching circuit 107, an FET 62, and an inductor 76 and resistor 92 for bias application. The drain of the FET 62 whose gate is connected to the local oscillator 9 is connected to the voltage source (voltage $V_{DD}$) via the inductor 76; the gate of the FET 62 is also connected to the voltage source (voltage $V_{GG}$) that is shared with the FETs 61, 63, and 64. The drain of the FET 62 is also connected to the local oscillator input matching circuit 107, while the source of the FET 62 is grounded.

Further, an IF input matching circuit 108 is provided in the rear-end stage of the transmitting system circuit, while an IF output matching circuit 109 is provided in the front-end stage of the receiving system circuit. For the FETs 61, 62, 63, and 64, the above-mentioned TMT having good response to the deepness of the gate bias, for example, may be used advantageously, but low-cost, conventional GaAs FETs may also be used. The GaAs FET has the advantage that since it can be formed integrally with a switch, the circuit can be fabricated in monolithic form.

Next, the operation of the above-configured circuit will be described. First, in reception, $V_{ctl1}$ for each of the switches 4, 6, 7 is set, for example, to 0 V to turn on the corresponding FET, and $V_{ctl2}$ is set, for example, to −3 V to turn off the corresponding FET, as shown in FIG. 5. The bias voltages $V_{DD}$ and $V_{GG}$ for the transmit-receive common amplifiers 23 and 24 are set at optimum values, as in the prior art example, that is, at values that provide low noise characteristic and that minimize current consumption; for example, $V_{DD}$=3 V and $V_{GG}$=−2 V. For the mixer 10 and buffer amplifier 8, since their drain bias is fixed to a predetermined value (for example, always ON with $V_{DD}$=3 V) and their gate bias needs to be set deep to reduce current consumption, as for the transmit-receive common amplifiers 23 and 24, they share the common voltage source with the transmit-receive common amplifiers 23 and 24.

Under such bias conditions, a received signal is first passed through the FET 52 in the ON state in the switch 4 that separates reception and transmission, and then inputted to the transmit-receive common amplifiers 23, 24 via the BPF 42. Usually, the amplifier input matching circuit 111 is designed to minimize the noise figure of the amplifier, and the amplifier output matching circuit 112 is adjusted to achieve matching so as to maximize the power added efficiency of the amplifier for transmission. The received RF signal is further passed through the BPF 43 and the FET 57 in the ON state, and fed into the mixer 10 where it is mixed with an output signal from the local oscillator 9 for conversion into an IF signal. Since the input/output impedance of the BPF 43 is usually 50 Ohms, the input circuit of the mixer 10 is matched to 50 Ohms at the RF band, and the mixer output matching circuit 106 also is adjusted for matching at the RF band so that the output signal from the mixer 10 is fed in optimum conditions into the BPF 42 during the transmission period hereinafter described. The IF signal outputted from the mixer 10 is passed through the FET 60 in the ON state and matched by the IF output matching circuit 109 before being transferred to the receiving system circuit for demodulation.

If the level of the received signal is greater than a predetermined level, the ON/OFF state only of the FETs 51, 52 in the switch 4 is reversed so that the received signal is directed via the node 11 and switch 6 and fed directly into the mixer 10 without being passed through the transmit-receive common amplifiers 23, 24. Accordingly, the variable-gain amplifier do not need, which was the case with the prior art example, to handle a large received signal level, and it is not necessary to control the gate bias for the amplifiers.

On the other hand, in transmission, $V_{ct11}$ is set, for example, to −3 V to turn off the corresponding FET, and $V_{ct12}$ is set, for example, to 0 V to turn on the corresponding FET, as shown in FIG. 6. Further, the drain bias for the transmit-receive common amplifiers 23, 24 (FETs 63, 64) is fixed to the predetermined value, i.e., $V_{DD}$=3 V, and the gate bias is set less deep than during the receiving period, for example, $V_{GG}$=−1 V, the bias conditions thus being set to obtain an output power level that satisfies the specification of the communication apparatus. The gate bias for the mixer 10 (FET 61) and buffer amplifier 8 (FET 62) is set less deep than during the receiving period, as for the transmit-receive common amplifiers 23 and 24, to increase the output power level as compared to that during the receiving period. Accordingly, the gate bias for the mixer 10 and buffer amplifier 8 can be shared with that for the transmit-receive common amplifiers 23 and 24.

Under such bias conditions, a digital-modulated signal is inputted from the transmitting system circuit to the mixer 10 via the IF input matching circuit 108 and via the FET 58 in the ON state. In the mixer 10, the signal is mixed with an output signal from the local oscillator 9 supplied via the buffer amplifier 8, for up conversion. The bias applied to the first gate of the dual-gate FET 61 in the mixer 10 and to the gate of the FET 62 in the buffer amplifier 8 is set less deep than during the receiving period, so that the output power of the local oscillator 9 to be fed into the mixer 10 is increased, with the result of increased conversion gain and increased output power level. The output signal from the mixer 10 is matched in the mixer output matching circuit 106 to 50 Ohms, and is inputted to the transmit-receive common amplifiers 23, 24 via the FET 59 in the ON state and via the BPF 42. The transmit-receive common amplifiers 23, 24 amplify the input signal to an output power level that satisfies the specification of the communication apparatus, and the amplified RF signal is directed to the antenna 1 via the BPF 43 and via the FET 51 in the ON state.

In the prior art example, since the reception amplifiers 21, 22 and the transmission amplifiers 31, 32 were provided separately, the applied bias had to be varied between reception and transmission to put the transmission amplifiers 31, 32 during the receiving period, and the reception amplifiers 21, 22 during the transmitting period, into the pinch-off condition. By contrast, in the example of the present invention, no such bias control is needed because of the provision of the transmit-receive common amplifiers 23, 24 that operate at all times. Furthermore, in the prior art example, the BPF 41 was interposed between the antenna 1 and the switch 4, but in the example of the present invention, the received signal from the antenna 1 is passed through the BPF 42 before it is amplified by the transmit-receive common amplifiers 23, 24, so that there is no need to provide a BPF preceding the switch 4.

In the example of the present invention, the gate bias for the FETs 63, 64 in the transmit-receive common amplifiers 23, 24 is varied to handle the transmitting and receiving conditions properly.

Mobile communication apparatus such as portable telephones require an output power level greater than the value provided in the specification to send radio waves to a distant place. Since terminals of mobile communication apparatus usually use batteries as the power supply, the supply voltage is fixed. Accordingly, to obtain a large power level in transmission, the gate bias for the FET of the amplifier is set shallow to increase the current amplitude. On the other hand, in reception, the current consumption needs to be reduced to achieve the longest possible standby time. Accordingly, in reception, the gate bias for the FET of the amplifier is set deep to reduce the current consumption.

However, in the case of an amplifier using a single active element formed, for example, from an FET for both transmission and reception (the transmit-receive common amplifiers 23, 24 in the example of the present invention), simply changing the gate bias may not be sufficient to satisfy the specifications respectively required for transmission and reception. For example, since the gate bias is set deep in reception, the gain of the FET itself decreases and the input/output impedance increases, as compared with the case when the gate bias is set shallow. Accordingly, if the input/output matching circuits are designed to provide optimum performance for transmission, i.e., to increase the output power level, the input/output return loss of the amplifiers in reception varies and the gain decreases. Conversely, if they are designed to provide optimum performance for reception, i.e., to allow a certain degree of return loss and to provide low noise characteristic, when the bias necessary for transmission is applied the gain may become too large, which can cause oscillation. In the case of communication apparatus, since spurious interference from transmission is limited, amplifiers thus designed cannot be used.

To avoid this problem, the present invention employs a transmit-receive common amplifier configuration wherein a resistor is inserted between FET's drain and gate and feedback is performed via the resistor, the gate bias being linked with the feedback resistor to control the amount of feedback and to handle the transmitting and receiving conditions properly. More specifically, during reception the resistance value is increased to decrease the amount of feedback so that the largest possible gain can be obtained, while during transmission the resistance value is reduced to increase the amount of feedback so that the gain is reduced for stability.

Figure 7:
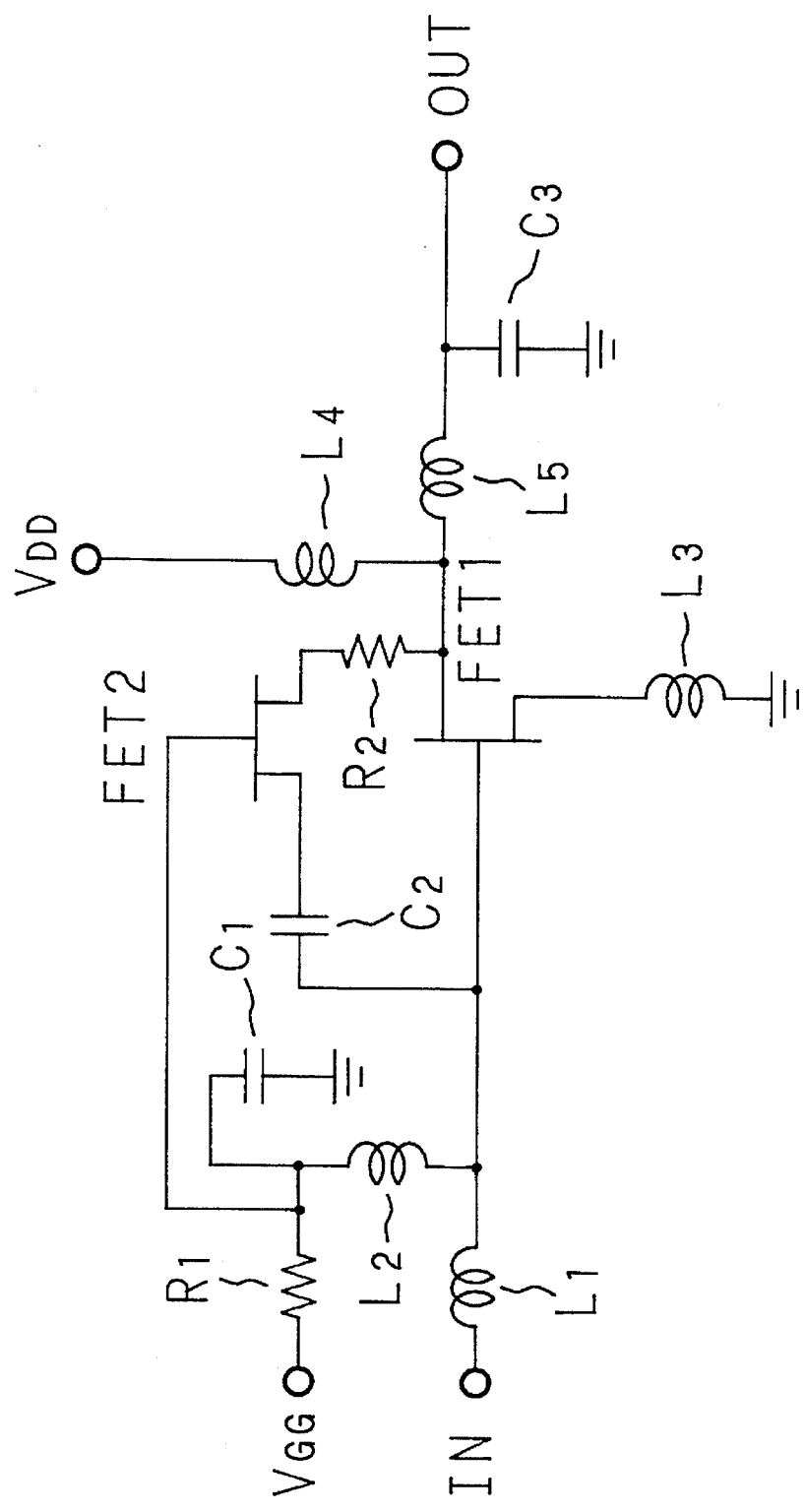
FIG. 7 is a circuit diagram of a transmit-receive common amplifier according to the present invention.

The circuit configuration of the thus configured transmit-receive common amplifier is shown in FIG. 7. In FIG. 7, FET1 is an FET for amplification, and FET2 for controlling the amount of feedback. The gate of the FET1 is connected to an input terminal via an inductor L1 (3 to 5 nH), and also to a voltage source (voltage: $V_{GG}$) via an inductor L2 (3 to 5 nH) and resistor R1 (3 kΩ or larger). The drain of the FET1 is connected to an output terminal via an inductor L5 (1 to 3 nH), and also to a voltage source (voltage: $V_{DD}$) via an inductor L4 (20 nH). The source of the FET1 is grounded via an inductor L3 (0.5 nH). The gate of the FET2 is connected via the resistor R1 to the voltage source (voltage: $V_{GG}$) that is shared with the FET1. The drain of the FET2 is connected, via a resistor R2 (300Ω) and via the inductor L4, to the voltage source (voltage: $V_{DD}$) that is shared with the FET1. The source of the FET2 and the gate of the FET1 is connected via a capacitor C2 (10 pF). A node between the resistor R1 and the inductor L2 is grounded via a capacitor C1 (10 to 20 pF). The output terminal is grounded via a capacitor C3 (1 to 4 pF). In this configuration, the resistors R1, R3 and the capacitor C1 are passive components necessary for applying the gate bias, the capacitor C2 is a capacitor for blocking the direct current, the resistor R2 is a resistor for controlling the amount of feedback for the whole circuit, the inductors L1 and L2 are inductors for input matching, and the inductors L4, L5 and the capacitor C3 are for output matching. The amplifier shown in FIG. 7 is designed to operate at 1.9 GHz.

Next, the operation of the above circuit will be described. In reception, when the gate bias $V_{GG}$ is set deep, the deep bias is also applied to the FET2, which in effect increases the feedback resistance and thus reduces the amount of feedback to the FET1, increasing the gain. For example, when the circuit is designed to operate at 1.9 GHz band, the gate bias $V_{GG}$ is set at −2 V, and the gate width of the FET2 is set so that the total feedback resistance in reception is about 1 k Ω (including the resistor R2 of 300 Ω), the characteristics shown below are obtained.

Gain: 10 dB

Input return loss: −12 dB

Output return loss: −6 dB

Noise figure: 2 dB

Current consumption: 20 mA

On the other hand, when the gate bias $V_{GG}$ is set shallow in transmission, the applied bias for the FET2 is also shallow, which in effect reduces the feedback resistance and thus increases the amount of feedback to the FET1, reducing the gain. When the gate bias $V_{GG}$ for transmission is set at −1 V, for example, the total feedback resistance is about 500 Ω, and the characteristics at 1.9 GHz are as follows:

Gain: 10 dB

Input return loss: −14 dB

Output return loss: −8 dB

Output power: 160 mW

Current consumption: 250 mA

Thus, the gain is the same in reception as in transmission, and the specified characteristics can be obtained for both transmission and reception.

By using the transmit-receive common amplifier of the above configuration, it is possible to overcome the problem that may arise with the communication apparatus of the present invention (that is, when the gate bias for the transmit-receive common amplifier FET is varied between transmission and reception, the input and output impedances change and it is difficult to achieve matching between the input and output).

Figure 8:
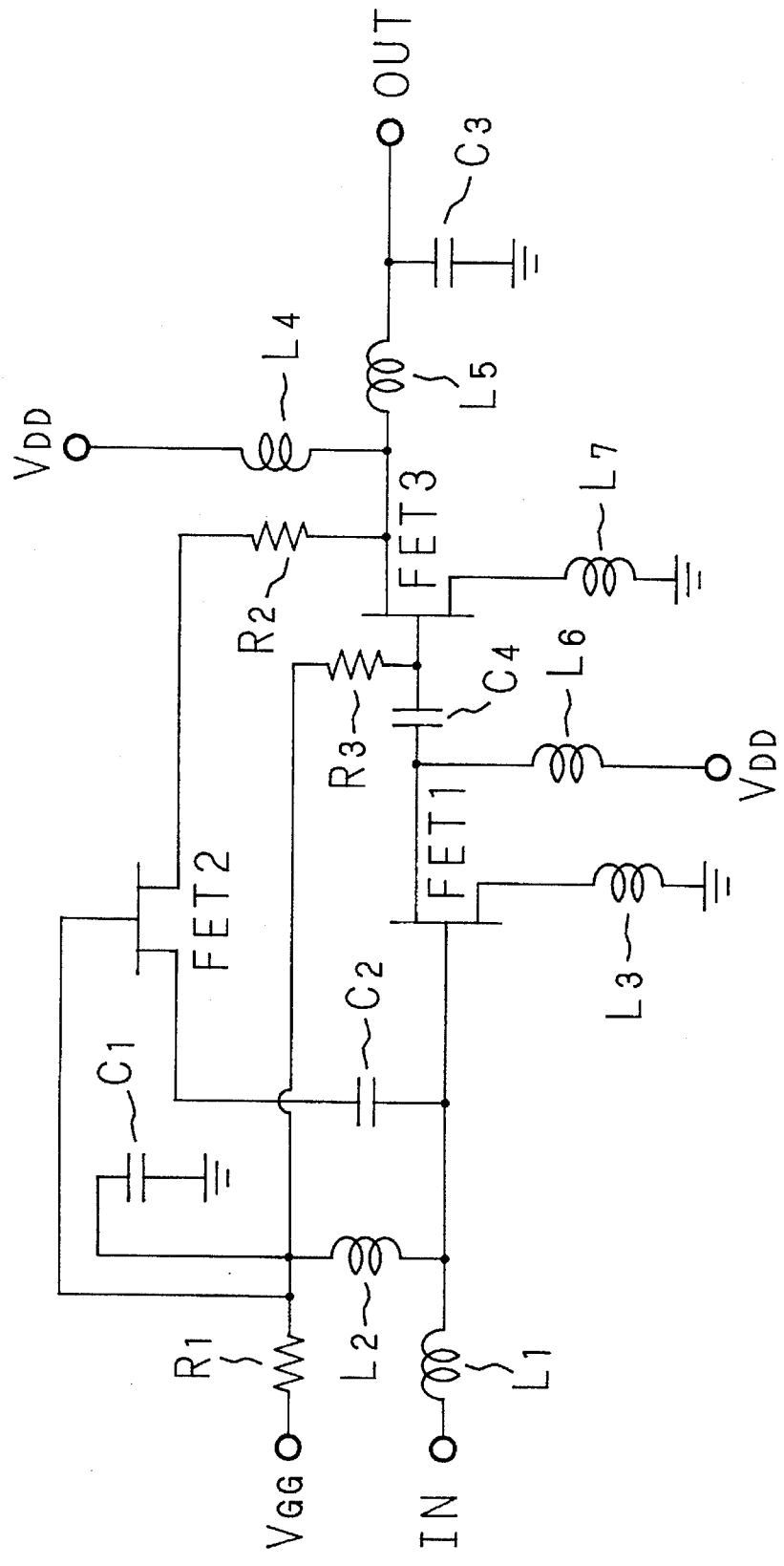
FIG. 8 is a circuit diagram of a transmit-receive common amplifier used in the communication apparatus of the present invention.

FIG. 8 shows a circuit configuration in which the single-stage transmit-receive common amplifier design described above is applied to the transmit-receive common amplifiers 23, 24 of the two-stage configuration shown in FIG. 4. In FIG. 8, FET1 and FET 3 are FETs for amplification, and FET2 is an FET for controlling the amount of feedback. In FIG. 8, the resistors R1 and R2, the inductors L1, L2, L3, L4 and L5, and the capacitors C1, C2 and C3 are the same as those shown in FIG. ?. The gate of the FET3 is connected, via a resistor R3 (3 k Ω or larger) and via the resistor R1, to the voltage source (voltage: $V_{GG}$) that is shared with the FET1 and FET2. A capacitor C4 (the capacitor 79 of 14 pF shown in FIGS. 5 and 6) for shutting off the interstage DC component is interposed between the drain of the FET1 and the gate of the FET3. The drain of the FET1 is connected to the voltage source (voltage: $V_{DD}$) via an inductor L6 (20 nH). The source of the FET3 is grounded via an inductor L7 (0.5 nH).

Figure 9:
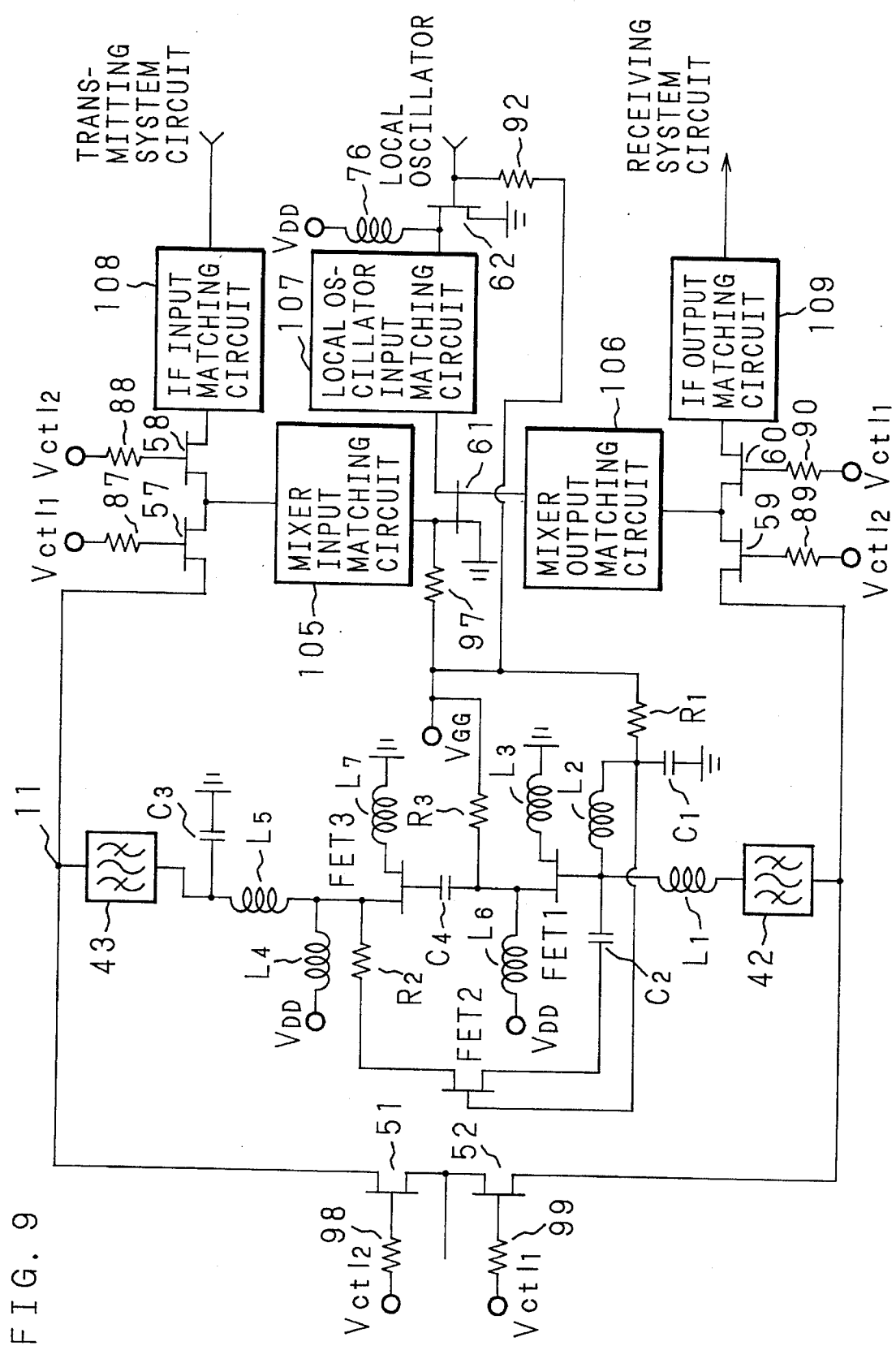
FIG. 9 is a diagram showing the circuit configuration of the RF section of the communication apparatus according to the present invention.

In FIG. 4, the transmit-receive common amplifiers 23, 24 of the above configuration are interposed between the BPFs 42 and 43, the input terminal shown in FIG. 8 being connected to an output side of the BPF 42 in FIG. 4 and the output terminal in FIG. 8 connected to an input side of the BPF 43 in FIG. 4. FIG. 9 shows the general configuration of the RF section in which the transmit-receive common amplifiers of the two-stage configuration shown in FIG. 8 are incorporated.

In the above example, the two FETs, FET1 and FET3, used for amplifying operation, are controlled together by controlling the amount of feedback from a single FET, the FET2. However, it is also possible to adjust the overall gain by controlling the amount of feedback separately for each of the FET1 and FET3, though detailed explanation is omitted here.

In FIG. 4, a low-pass filter may be provided between the switch 6 and the transmitting system circuit and/or between the switch 7 and the receiving system circuit. In addition, a band-pass filter may be provided between the switch and the mixer 10 and/or between the switch 7 and the mixer 10.

As described, according to the communication apparatus of the invention, the provision of the transmit-receive common amplifier eliminates the need to turn the power on and off when switching between transmission and reception, which contributes to further reducing the frequency variations by the difference of load impedance of the synthesizer associated with the switching operation, and hence a reduction in system noise. Furthermore, not only the whole circuitry but also the bias and control circuitry is simplified as compared to the prior art example. This increases specifically the production yield, and also contributes to a further reduction in size of the communication apparatus. Furthermore, because of the simplified bias circuitry, the transmit-receive common amplifier, mixer, buffer amplifier, and switches can be easily fabricated on a single chip as a monolithic microwave IC (MMIC).

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A communication apparatus, comprising:

a transmit-receive common amplifier for amplifying a transmitted signal or a received signal;

a transmit-receive common mixer for frequency-mixing the transmitted signal or the received signal with a local oscillator output signal;

a first switch, connected to an input side of said transmit-receive common amplifier, to said mixer and to an input side of a receiving system circuit, for switching path connection between a transmission path and a reception path;

a second switch, connected to an output side of said transmit-receive common amplifier, to said mixer and to an output side of a transmitting system circuit, for switching path connection between the transmission path and the reception path;

a buffer amplifier disposed on a local oscillation input side of said mixer; and said transmit-receive common amplifier, said mixer and said buffer amplifier each respectively including an FET as an active element, and a common gate bias being applied to said respective FETs.

2. A communication apparatus according to claim 1, further comprising:

a transmit-receive common filter for attenuating spurious interference from the transmitted signal or the received signal.

3. A communication apparatus according to claim 1, wherein said transmit-receive common amplifier includes a plurality of field-effect transistors (FETs) as an active element.

4. A communication apparatus according to claim 3, further comprising:

a power supply for applying a deeper gate bias to said FETs during reception than during transmission.

5. A communication apparatus according to claim 1, further comprising:

a power supply for applying a deeper gate bias to said respective FETs during reception than during transmission.

6. A communication apparatus according to claim 1, further comprising:

a transmit-receive common antenna; and a third switch, connected to said antenna, to the input side of said amplifier and to the output side of said transmit-receive common amplifier, for switching path connection between the transmission path and the reception path.

7. A communication apparatus according to claim 1, wherein said amplifier comprises:

a first active element for amplification;

a first matching circuit for impedance matching at an input side;

a second matching circuit for impedance matching at an output side; and a feedback circuit having a feedback resistor and a second active element for feedback, in which the amount of feedback to said first active element is varied according to the bias applied to said first active element.

8. A communication apparatus, comprising:

a transmit-receive common amplifier for amplifying each of a transmitted signal or a received signal;

a transmit-receive common mixer for frequency-mixing the transmitted signal or the received signal with a local oscillator output signal;

a first switch, connected to an input side of said transmit-receive common amplifier, to said mixer and to an input side of a receiving system circuit, for switching path connection between a transmission path and a reception path; and a second switch, connected to an output side of said transmit-receive common amplifier, to said mixer and to an output side of a transmitting system circuit, for switching path connection between the transmission path and the reception path, wherein in transmission, the transmitted signal passed via said second switch is mixed in said mixer with the local oscillator output signal, the transmitted signal after mixing being inputted to said transmit-receive common amplifier via said first switch, in reception, when the level of the received signal is smaller than a predetermined level, the received signal is amplified by said transmit-receive common amplifier and is inputted via said second switch to said mixer for mixing with the local oscillator output signal, the received signal after mixing being outputted via said first switch, in reception, when the level of the received signal is greater than the predetermined level, the received signal is inputted without being passed through said transmit-receive common amplifier and via said second switch to said mixer for mixing with the local oscillator output signal, the received signal after mixing being outputted via said fist switch, and when the level of the received signal is greater than a predetermined level, the mixer connected to the reception path is switched to be connected to the transmission path and said transmit-receive common amplifier is turned off so that the impedance as viewed from the transmission path toward said transmit-receive common amplifier increases.

9. A communication apparatus as in claim 8, wherein said transmit-receive common amplifier is applied with operating voltage at all times.

10. A communication apparatus as in claim 8 further comprising;

a buffer amplifier disposed on a local oscillation input side of said transmit-receive common mixer, wherein said transmit-receive common amplifier, said transmit-receive common mixer and said buffer amplifier respectively include an FET as an active element, and a common gate bias applied to said respective FETs.

11. An amplifier, comprising:

a first active element for amplification;

a first matching circuit for impedance matching at an input side;

a second matching circuit for impedance matching at an output side; and a feedback circuit having a feedback resistor and a second active element for feedback, in which the amount of feedback to said first active element is varied according to the bias applied to said first active element, wherein both of said first and second active elements are FETs which are supplied with a common gate bias, and said feedback circuit is interposed between the gate and drain of the FET that forms said first active element.

12. An amplifier according to claim 11, wherein said feedback circuit includes a capacitor for blocking direct current.

13. An amplifier comprising:

a first active element for amplification;

a first matching circuit for impedance matching at an input side;

a second matching circuit for impedance matching at an output side; and a feedback circuit having a feedback resistor and a second active element for feedback, in which the amount of feedback to said first active element is varied according to the bias applied to said first active element wherein said first active element comprises a front-stage FET and a rear-stage FET, forming a two-stage FET configuration, while said second active element comprises a single FET, these FETs being supplied with a common gate bias, and said feedback circuit is interposed between the gate of said front-stage FET and the drain of said rear-stage FET.

14. An amplifier according to claim 13, wherein said feedback circuit includes a capacitor for blocking direct current.

15. A communication apparatus comprising:

a transmit-receive common amplifier for amplifying a transmitted signal or a received signal;

a transmit-receive common mixer for frequency-mixing the transmitted signal or the received signal with a local oscillator output signal;

a first switch, connected to an input side of said transmit-receive common amplifier, to said mixer and to an input side of a receiving system circuit, for switching path connection between a transmission path and a reception path; and a second switch, connected to an output side of said transmit-receive common amplifier, to said mixer and to an output side of a transmitting system circuit, for switching path connection between the transmission path and the reception path, wherein said transmit-receive common amplifier comprises:
a first active element for amplification;
a first matching circuit for impedance matching at an input side;
a second matching circuit for impedance matching at an output side; and
a feedback circuit having a feedback resistor and a second active element for feedback, in which the amount of feedback to said first active element is varied according to the bias applied to said first active element, and wherein
both of said first and second active elements are FETs which are supplied with a common gate bias, and said feedback circuit is interposed between the gate and drain of the FET that forms said first active element.

16. A communication apparatus comprising:

a transmit-receive common amplifier for amplifying a transmitted signal or a received signal;

a transmit-receive common mixer for frequency-mixing the transmitted signal or the received signal with a local oscillator output signal;

a first switch, connected to an input side of said transmit-receive common amplifier, to said mixer and to an input side of a receiving system circuit, for switching path connection between a transmission path and a reception path:

a second switch, connected to an output side of said transmit-receive common amplifier, to said mixer and to an output side of a transmitting system circuit, for switching path connection between the transmission path and the reception path, wherein said transmit-receive common amplifier comprises:
a first active element for amplification;
a first matching circuit for impedance matching at an input side;
a second matching circuit for impedance matching at an output side; and
a feedback circuit having a feedback resistor and a second active element for feedback, in which the amount of feedback to said first active element is varied according to the bias applied to said first active element, and wherein
both of said first and second active elements are FETs, and during reception in which the received signal is amplified, the common gate bias applied to the FETs that form said first and second active elements is set deeper than during transmission in which the transmitted signal is amplified.

17. A communication apparatus comprising:

a transmit-receive common amplifier for amplifying a transmitted signal or a received signal;

a transmit-receive common mixer for frequency-mixing the transmitted signal or the received signal with a local oscillator output signal;

a first switch, connected to an input side of said transmit-receive common amplifier, to said mixer and to an input side of a receiving system circuit, for switching path connection between a transmission path and a reception path; and a second switch, connected to an output side of said transmit-receive common amplifier, to said mixer and to an output side of a transmitting system circuit, for switching path connection between the transmission path and the reception path, wherein said transmit-receive common amplifier comprises:
a first active element for amplification;
a first matching circuit for impedance matching at an input side;
a second matching circuit for impedance matching at an output side; and
a feedback circuit having a feedback resistor and a second active element for feedback, in which the amount of feedback to said first active element is varied according to the bias applied to said first active element, and wherein said first active element consists of a front-stage FET and a rear-stage FET, forming a two-stage FET configuration, while said second active element consists of a single FET, these FETs being supplied with a common gate bias, and said feedback circuit is interposed between the gate of said front-stage FET and the drain of said rear-stage FET.

18. A communication apparatus, comprising:

a transmit-receive common amplifier for amplifying each of a transmitted signal or a received signal;

a transmit-receive common mixer for frequency-mixing the transmitted signal or the received signal with a local oscillator output signal;

a first switch, connected to an input side of said transmit-receive common amplifier, to said mixer and to an input said of a receiving system circuit, for switching path connection between a transmission path and a reception path; and a second switch, connected to an output side of said transmit-receive common amplifier, to said mixer and to an output side of a transmitting system circuit, for switching path connection between the transmission path, and the reception path wherein when the level of the received signal is greater than a predetermined level, the mixer being connected to the reception path is switched to be connected to the transmission path and the transmit-receive common amplifier is turned off so that the impedance as viewed from the transmission path toward said transmit-receive common amplifier increases.

19. A communication apparatus as in claim 18 further comprising;

a buffer amplifier disposed on a local oscillation input side of said transmit-receive common mixer, wherein
said transmit-receive common amplifier, said transmit-receive common mixer and said buffer amplifier, respectively, include an FET as an active element, and a common gate bias applied to said respective FETs.

* * * * *